(12) United States Patent
Mercier

(10) Patent No.: US 6,590,379 B2
(45) Date of Patent: Jul. 8, 2003

(54) APPARATUS FOR DETECTING THE ENVELOPE OF AN INPUT SIGNAL

(75) Inventor: Claude Mercier, Peterborough (CA)

(73) Assignee: Siemens Milltronics Process Instruments, Inc., Peterborough (CA)

( * ) Notice: Subject to any disclaimer, the term of this patent is extended or adjusted under 35 U.S.C. 154(b) by 33 days.

(21) Appl. No.: 09/841,048

(22) Filed: Apr. 25, 2001

(65) Prior Publication Data

US 2002/0158623 A1 Oct. 31, 2002

(51) Int. Cl.[7] .............................................. G01R 19/22
(52) U.S. Cl. ...................................... 324/118; 324/120
(58) Field of Search ................................ 324/118, 73.1, 324/158.1, 120; 329/352, 369, 366

(56) References Cited

U.S. PATENT DOCUMENTS 4,319,196 A * 3/1982 Kwan ........................... 329/352
4,890,066 A * 12/1989 Straver et al. ............... 329/369

* cited by examiner

*Primary Examiner*—Vinh P. Nguyen
(74) *Attorney, Agent, or Firm*—Birch, Stewart, Kolasch & Birch, LLP

(57) ABSTRACT

An envelope detector for detecting the envelope of an input signal. The envelope detector includes an inverter for inverting the input signal and two offsetting circuits for offsetting the input signal and the inverted input signal so as to align the peaks of the signals with zero volts. The two offset signals are then summed, which results in a signal proportional to the inverted envelope of the input signal.

10 Claims, 4 Drawing Sheets

APPARATUS FOR DETECTING THE ENVELOPE OF AN INPUT SIGNAL

FIELD OF THE INVENTION

This invention relates to full wave envelope detectors, and more particularly to a low power consumption envelope detector suitable for detection of low level signals over a broad range of frequencies.

BACKGROUND OF THE INVENTION

A simple and common method of detecting the envelope of an input signal is with a diode detector. It has been found that the conventional diode envelope detector is inappropriate for use in detecting low level signals because it is necessary for the input signal to overcome a threshold voltage to forward bias the diode. Moreover, at low signal levels, the current/voltage transfer characteristic of a diode is highly non-linear. A known solution to the problem of non-linearity is to substantially amplify the low level input signal so that the diode operates on the more linear portion of its transfer curve. It will be appreciated that this solution is costly in terms of power consumption.

Another known method of detecting the envelope of an input signal involves using an operational amplifier instead of a diode. This method permits the detection of relatively low level signals; however, at higher frequencies this method requires high speed op-amps capable of following the waveforms. High speed op-amps consume a considerable amount of power rendering this method inappropriate for low power consumption applications.

Accordingly, there remains a need for an envelope detector capable of detecting low level signals in the millivolt range and consuming a minimal amount of power. Such a device is especially desirable for industrial applications in which 4–20 milliampere communication wiring is commonplace and the costs of additional wiring over the dispersed area of an industrial plant can be prohibitive.

BRIEF SUMMARY OF THE INVENTION

The present invention provides a low power consumption envelope detector for low level signals which addresses the shortcomings associated with known envelope detectors.

The present invention comprises an input port for receiving the input signal; a first inverter for inverting the input signal and generating an inverted input signal; an offset stage for offsetting the input signal and the inverted input signal such that peaks in the signals are aligned at zero volts and generating an offset input signal and an offset inverted input signal; and a summer circuit for summing the offset input signal and the offset inverted input signal to generate, at an output port, a resultant signal corresponding to the envelope of the input signal.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Reference will now be made, by way of example, to the accompanying drawings which show a preferred embodiment of the present invention, and in which.

DETAILED DESCRIPTION OF THE PREFERRED EMBODIMENTS

Figure 1:
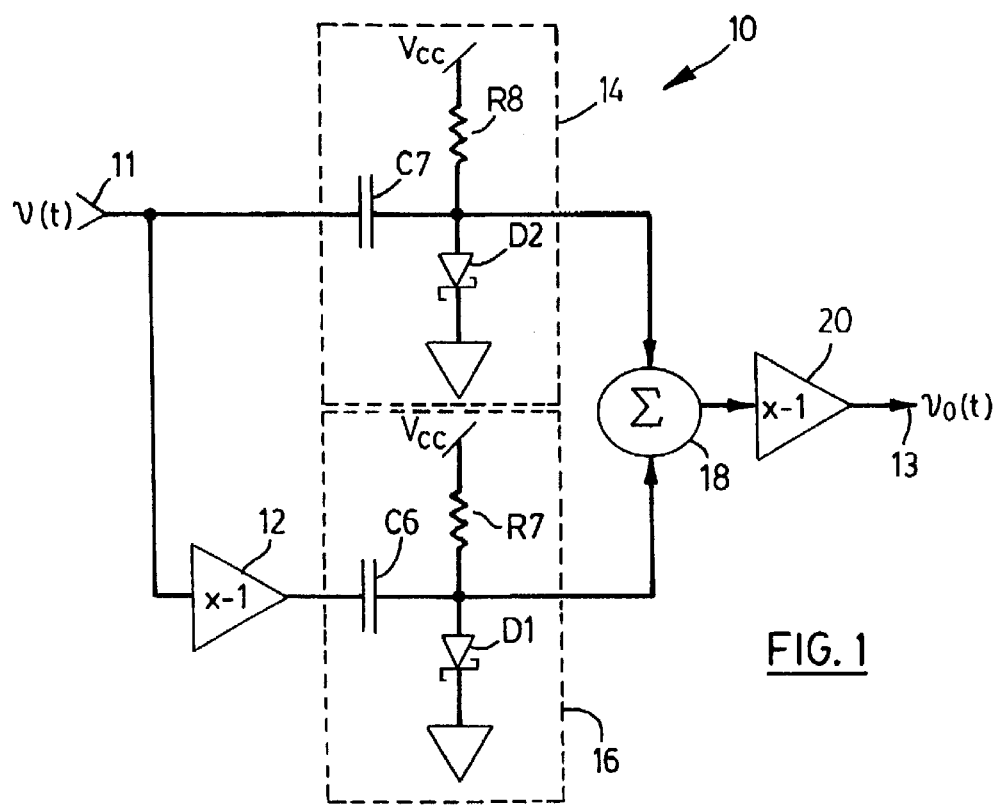
FIG. 1 is a block diagram of an envelope detector according to the present invention.
Figure 2:
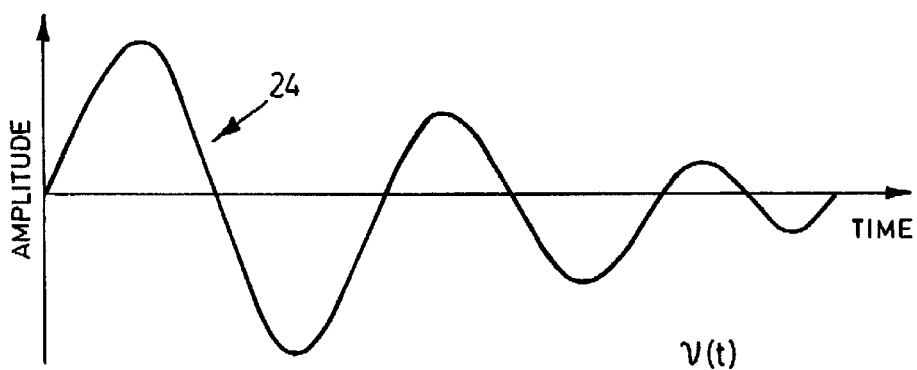
FIG. 2 is an amplitude-time graph of an input signal.

Reference is first made to FIG. 1, which shows in block diagram form an envelope detector 10 according to the present invention. As will be described in more detail below, the envelope detector 10 receives an input signal v(t) and generates an output signal $v_o(t)$ which is proportional to the envelope of the input signal v(t).

The envelope detector 10 as shown in FIG. 1 comprises an input port 11, a first inverter 12, two offset circuits 14 and 16 and a summer 18.

Figure 3A:
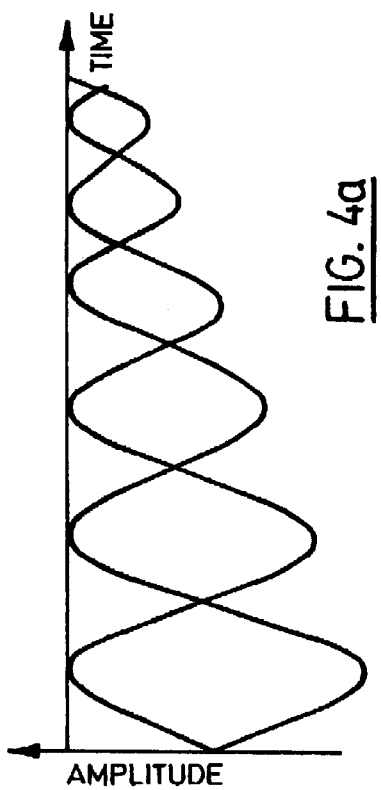
FIGS. 3(a) and 3(b) is an amplitude-time graph of the offset input signal and the offset inverted input signal, respectively.
Figure 3B:
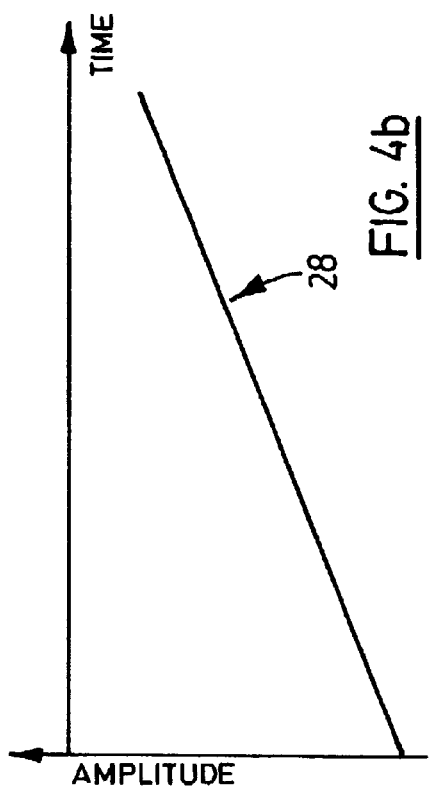
Figure 4A:
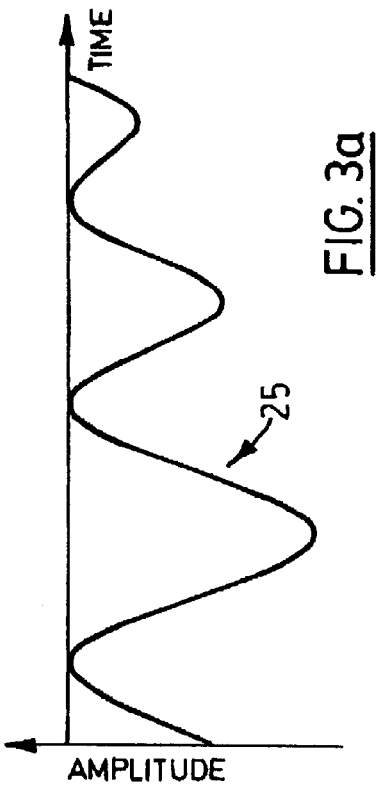
FIG. 4(a) is an amplitude-time graph showing the superposition of the offset input signal and the offset inverted input signal from FIGS. 3(a) and 3(b), respectively.
Figure 4B:
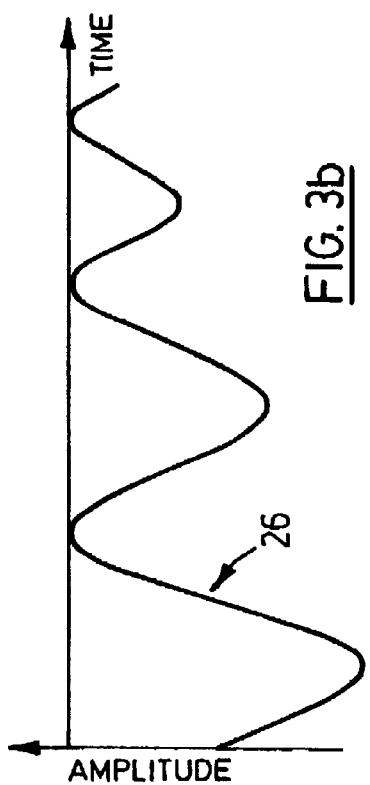
FIG. 4(b) is an amplitude-time graph of the summation of the offset input signal and the offset inverted input signal from FIGS. 3(a) and 3(b), respectively.

The first inverter 12 inverts the input signal v(t) received at the input port 11 and outputs an inverted input signal. The offset circuit 14 receives the input signal v(t) from the input port 11 and negatively offsets the input signal v(t) to produce an offset input signal 25 as shown in FIG. 3(a). Similarly, the offset circuit 16 receives the inverted input signal from the first inverter 12 and offsets the inverted input signal to produce an offset inverted input signal 26 as shown in FIG. 3(b). The summer 18 sums the offset input signal 25 and the offset inverted input signal 26 to generate a resultant signal 28 as shown in FIG. 4(b). The resultant signal 28 is proportional to the envelope of the input signal v(t). According to this aspect of the invention, the resultant signal 28 is proportional to the envelope of the input signal v(t) by a factor of minus two. In these circumstances the resultant signal may be inverted to produce an inverted resulting signal that is proportional to the envelope of the input signal by a factor of two. As shown in FIG. 1, a second inverter 20 is coupled to the output of the summer 18. The second inverter 20 inverts the resultant signal 28 to produce an output signal $v_o(t)$, which appears at the output port 13.

Reference is again made to FIGS. 1 to 4 to illustrate the operation of the envelope detector 10 with the sample input signal v(t) 24. The input signal v(t) comprises, for example, a portion of an amplitude modulated sinusoid signal, and the input signal v(t) may be described by expression (1), as follows:

$$v(t) = s(t) \cos(\Omega t) + A \cos(\Omega t) \qquad (1)$$

where: v(t) is the input signal; s(t) is the information signal; cos(ωt) is the sinusoidal carrier signal; and A is the amplitude of the carrier signal. Through the input port 11, the input signal v(t) is input into the first inverter 12 and into the offset circuit 14.

The input signal v(t) is inverted by the first inverter 12 to produce an inverted input signal which may be described by expression (2), as follows:

$$\overline{v}(t) = -s(t) \cos(\omega t) - A \cos(\omega t) \qquad (2)$$

The inverted input signal $\bar{v}(t)$ is applied to the input of the offset circuit 16. The offset circuits 14 and 16 cause the signals, v(t) and $\bar{v}(t)$, to be negatively offset, such that the positive peaks of the signals are at zero volts and the remainder of the signals are negative. FIG. 3(a) illustrates the effect of the offset circuit 14 on the sample input signal 24 from FIG. 2. Likewise, FIG. 3(b) illustrates the effect of the offset circuit 16 on the inverted sample input signal produced by the first inverter 12. Mathematically, the offset circuit 14 negatively offsets the input signal v(t) by the amplitude of the input signal, s(t)+A, such that the offset input signal is described by expression (3), below:

$$v_{offset}(t)=s(t)\cos(\omega t)+A\cos(\omega t)-(s(t)+A) \quad (3)$$

Similarly, the offset circuit 16 negatively offsets the inverted input signal by the amplitude of the inverted input signal, s(t)+A, such that the offset input signal described in FIG. 3(b) is described by expression (4), below:

$$\bar{v}_{offset}(t)=-s(t)\cos(\omega t)-A\cos(\omega t)-(s(t)+A) \quad (4)$$

The two offset signals $v_{offset}(t)$ and $\bar{v}_{offset}(t)$ are added together by the summer 18. FIG. 4(a) shows the two offset signals 25 and 26 superimposed upon each other. The summation of the two offset signals results in the resultant signal 28 depicted in FIG. 4(b). The resultant signal 28 in FIG. 4(b) is proportional to the inverse of the envelope of the sample input signal v(t) 24 in FIG. 2. The resultant signal, $v_r(t)$, is described by expression (5), as follows:

$$v_r(t)=v_{offset}(t)+\bar{v}_{offset}(t)$$
$$=s(t)\cos(\omega t)+A\cos(\omega t)-s(t)-A-s(t)\cos(\omega t)-A\cos(\omega t)-s(t)-A$$
$$=-2(s(t)+A) \quad (5)$$

The second inverter 20 shown in FIG. 1 can then be used to produce the output signal $v_o(t)$, which is described by expression (6), below:

$$v_o(t)=2(s(t)+A) \quad (6)$$

The output signal $v_o(t)$ is proportional to the envelop of the input signal v(t) by a factor of two.

Figure 5:
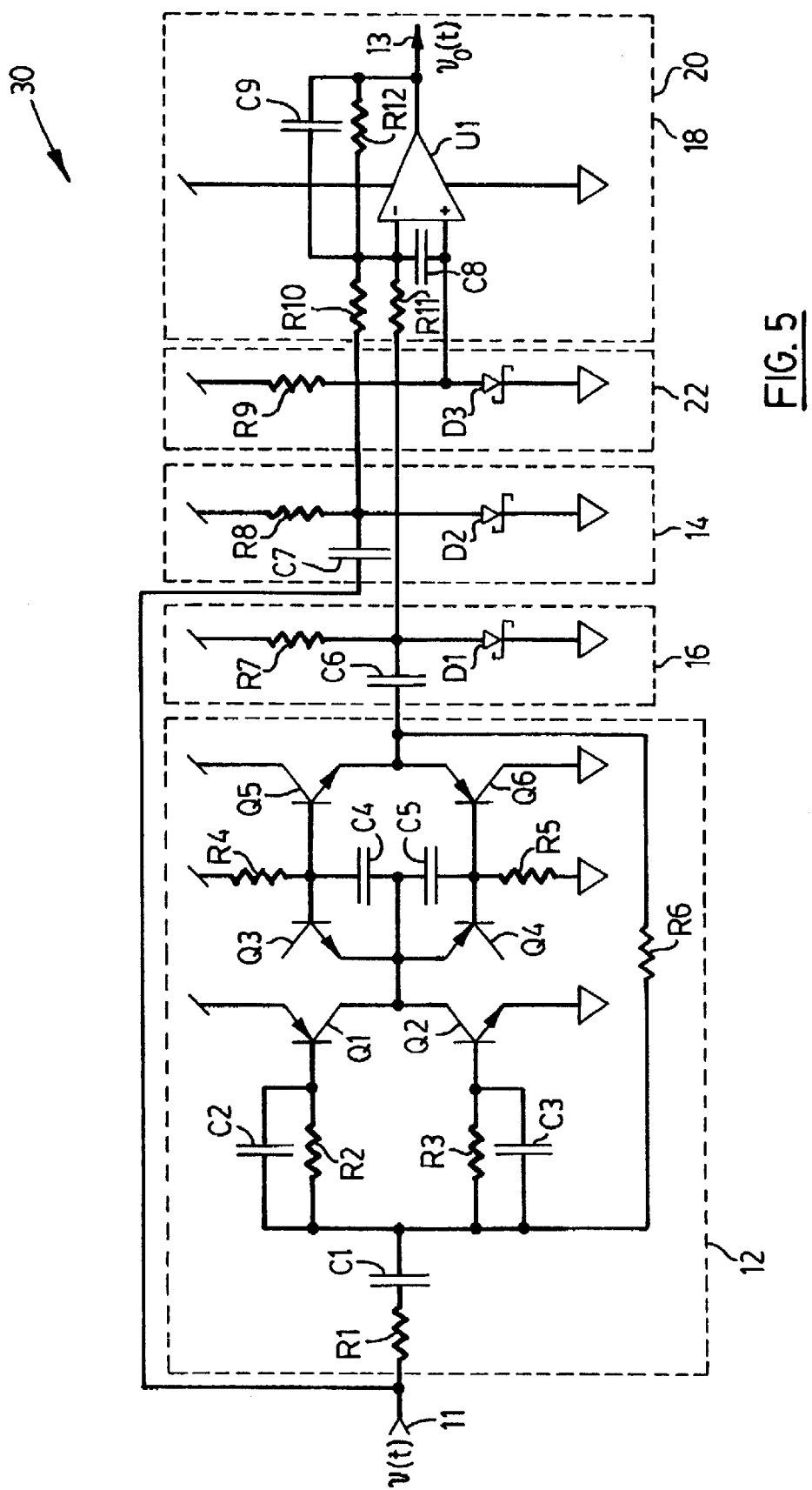
FIG. 5 is an electrical schematic of an implementation of the envelope detector of FIG. 1.

Reference is now made to FIG. 5 which is an electrical schematic of a circuit implementation 30 for the envelope detector 10 of FIG. 1. As shown in FIG. 5, the first inverter 12 comprises transistors Q1 and Q2 and resistors R1 and R6, where transistor Q1 is a PNP bipolar junction transistor (BJT) and transistor Q2 is an NPN BJT. The collector of transistor Q1 is connected to a positive supply rail $V_{cc}$. In this embodiment, the supply rail is 3.3 Volts. The emitter of Q2 is grounded and its collector is connected to the emitter of Q1 such that the two transistors Q1 and Q2 are configured in a "push-pull" arrangement. The input signal v(t) is applied through resistor R1, which in turn is coupled to the bases of transistors Q1 and Q2 through resistors R2 and R3, respectively. The resistor R6 is connected in a feedback loop between the output of the inverter 12 and the node between the resistor R1 and resistors R2 and R3. The ratio of the resistors–R6/R1 sets the gain of the first inverter 12. To produce a gain of minus one, the component values of the resistors R1 and R6 are equal. Transistors Q3, Q4, Q5 and Q6 comprise a current buffer to reduce the output impedance of the first inverter 12 and to increase its current capability. The first inverter 12 requires a low output impedance because the circuit 30 for the envelope detector 10 uses a number of high impedances and has certain stray capacitance. The combination of high impedances and stray capacitance limits the high frequency operation of the circuit 30. Accordingly, the current buffer enables the first inverter 12 to quickly discharge the stray capacitance, thereby improving the speed of the circuit 30.

As shown in FIG. 5, the offset circuit 14 comprises a resistor R8, a coupling capacitor C7 and a diode D2. The cathode of the diode D2 is grounded and its anode is connected to the resistor R8. In the preferred embodiment, the diode D2 is a Schottky diode, which is used because of its relatively low threshold voltage. The resistor R8 is also connected to the voltage supply rail $V_{cc}$ so as to provide a bias current to the diode D2, such that the current/voltage transfer characteristic of the diode D2 remains in the exponential region. The coupling capacitor C7 is connected to the input port 11 to receive input signal v(t) and is connected to the anode of the diode D2. The coupling capacitor C7 removes any DC component of the input signal v(t).

Similarly, offset circuit 16 comprises a biasing resistor R7, a diode D1 and a coupling capacitor C6. The offset circuit 16 is configured similarly to the offset circuit 14, but operates upon the inverted input signal provided by the inverter 12.

Preferably, the summer 18 and the second inverter 20 are implemented using an operational amplifier U1. The op-amp U1 is configured as a "weighted summer" with resistors R10 and R11 connected to the inverting input terminal and a resistor R12 connected in a feedback loop. Resistors R10, R11 and R12 are equal in component value so as to result in simple addition of the signals received through the resistors R10 and R11. The resistor R10 is connected to the output of the offset circuit 14 and the resistor R11 is connected to the output of the offset circuit 16. The configuration of the op-amp U1 results in the inversion of the sum of the offset input signal X and the offset inverted input signal X, thereby implementing the second inverter 20. The inverted resulting signal $v_o(t)$ appears at the output of the op-amp U1. Capacitors C8 and C9 are provided as shown to stabilize the circuit.

The diodes D1 and D2 used in the respective offset circuits 14 and 16 have a finite voltage drop across them, meaning that they produce an undesirable offset in the offset input signal and the offset inverted input signal. This unwanted offset can be removed prior to the summation through the use of a temperature compensating offset circuit 22. The temperature compensating offset circuit 22 comprises a biasing resistor R9 and a diode D3. The biasing resistor R9 and the diode D3 are configured in a similar fashion, and have like component values, to the biasing resistors R7 and R8 and the diodes D1 and D2 used in offsetting means 14 and 16. The anode of diode D3 is connected to the non-inverting input terminal of the op-amp U1, thereby reproducing the temperature variant voltage drop that appears across the diodes D1 and D2 and subtracting the voltage drop from the signals 25 and 26 to be added by the summer 18.

The values of the components shown in the preferred embodiment in FIG. 5 correspond to an optimization of the circuit for a 44 kHz carrier modulated with a 1 kHz information signal. It will be within the understanding of a person skilled in the art to adjust the component values to optimize the circuit for other frequencies.

Although the embodiment of the invention described above and in FIG. 5 employs discrete analog circuitry, the invention may also be implemented with integrated circuits.

Figure 6:
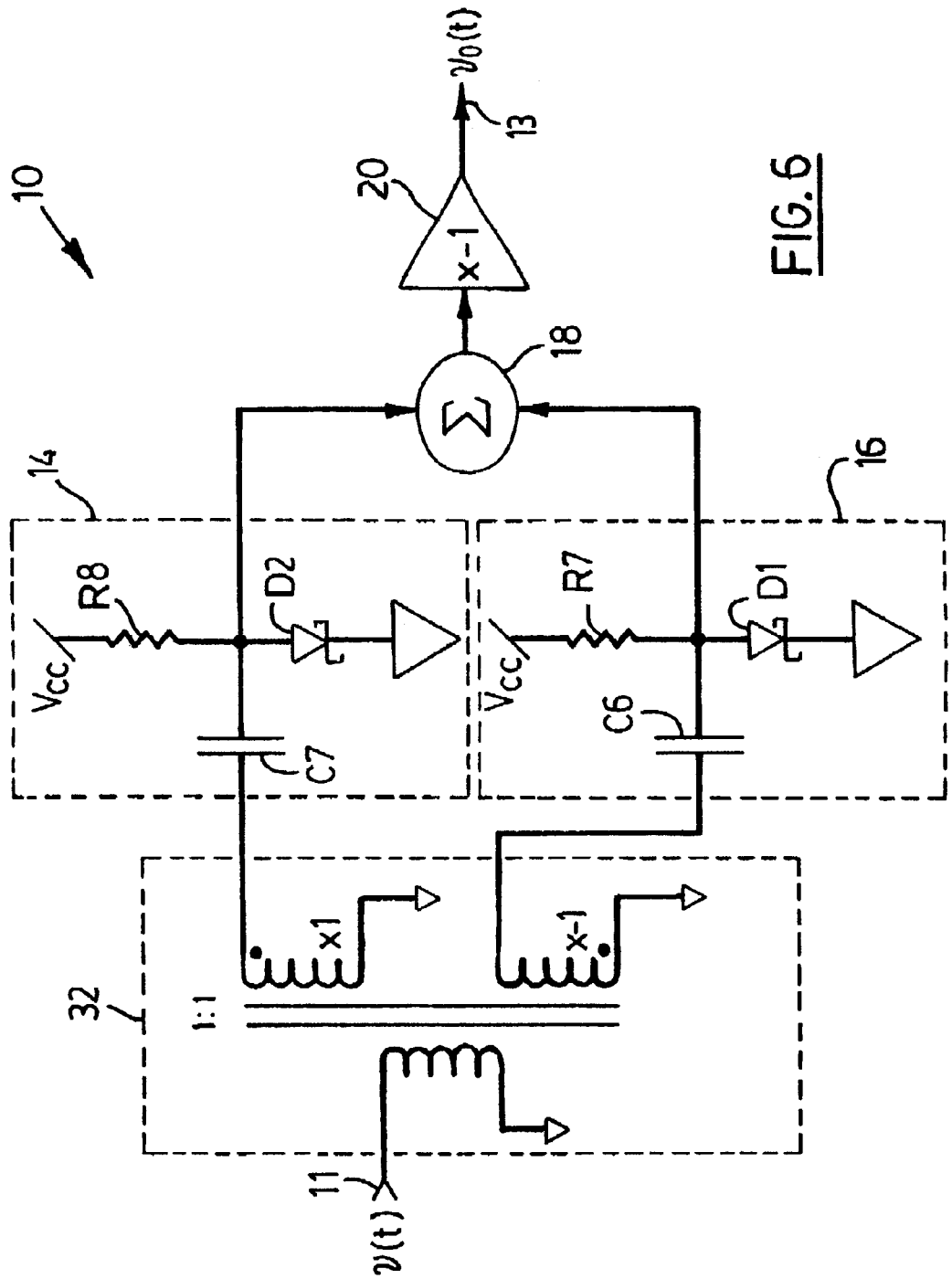
FIG. 6 is a block diagram of an envelope detector according to the present invention.

Reference is now made to FIG. 6 which shows a block diagram of the present invention wherein a transformer 32 is used to implement the inverter 12 shown in FIG. 1. The transformer 32 is selected to have a ratio of 1:1 and to have an inverted and a non-inverted output terminal. By utilizing a transformer 32, the envelope detector 10 may be operated at much higher frequencies, including microwave frequencies.

Advantageously, the envelope detector 10 according to the present invention provides a low level signal detector while enabling low power consumption applications. The combination of these features renders the invention applicable to a broad range of functions, including AM radio, television or echo detecting devices. The range of functions and implementations would be clear to one skilled in the art.

The present invention may be embodied in other specific forms without departing from the spirit or essential characteristics thereof. Certain adaptations and modifications of the invention will be obvious to those skilled in the art. Therefore, the above discussed embodiments are considered to be illustrative and not restrictive, the scope of the invention being indicated by the appended claims rather than the foregoing description, and all changes which come within the meaning and range of equivalency of the claims are therefore intended to be embraced therein.

I claim:

1. An envelope detector for detecting an envelope of an input signal, said envelope detector comprising:
    (a) an input port for receiving the input signal;
    (b) a first inverter coupled to said input port for inverting the input signal and generating an inverted input signal;
    (c) an offset stage having a first offset circuit coupled to said input port for offsetting said input signal such that peaks in the input signal are aligned at zero volts, and a second offset circuit coupled to the output of said first inverter for offsetting said inverted input signal such that peaks in said inverted input signal are aligned at zero volts, said first offset circuit generating an offset input signal and said second offset circuit generating an offset inverted input signal; and
    (d) a summer circuit having an input coupled to the output of said first offset circuit and to the output of said second offset circuit for summing said offset input signal and said offset inverted input signal to generate, at an output port, a resultant signal corresponding to the envelope of said input signal.

2. The envelope detector claimed in claim 1, further comprising a temperature compensating circuit coupled to said summer circuit for removing unwanted offset voltage caused by said offset stage in said offset input signal and said offset inverted input signal.

3. The enveloped detector claimed in claim 1, further comprising a second inverter coupled between said summer circuit and said output port for inverting said resultant signal and generating an output signal.

4. The envelope detector claimed in claim 1, wherein said first offset circuit comprises:
    a) a first semiconductor junction device for coupling said input signal to ground;
    b) a first biasing circuit coupled to said first semiconductor junction device for sinking a biasing current through said first semiconductor junction device such that the current/voltage characteristic of said first semiconductor junction device remains in an exponential region; and
    c) a capacitor coupled to said first semiconductor junction device for receiving the input signal.

5. The envelope detector claimed in claim 4, wherein said first semiconductor junction device comprises a diode.

6. The envelope detector claimed in claim 4, further comprising a second inverter coupled between said summer circuit and said output port for inverting said resultant signal and generating an output signal.

7. The envelope detector claimed in claim 4, further comprising a temperature compensating circuit coupled to said summer circuit for removing unwanted offset voltage caused by said offset stage in said offset input signal and said offset inverted input signal.

8. The envelope detector claimed in claim 7, wherein said temperature compensating circuit comprises:
    (a) a second semiconductor junction device coupled to said summer circuit for replicating the voltage drop across said first semiconductor junction device; and
    (b) a second biasing circuit coupled to said second semiconductor junction device for sinking a biasing current through said second semiconductor junction device such that the current/voltage characteristic of said second semiconductor junction device remains in an exponential region.

9. The envelope detector claimed in claim 8, wherein said first semiconductor junction device and said second semiconductor junction device each comprise a diode.

10. The envelope detector claimed in claim 1, wherein an implementation for said first inverter comprises a transformer.

* * * * *